(12) United States Patent  
Williams

(10) Patent No.: US 9,121,952 B2  
(45) Date of Patent: Sep. 1, 2015

(54) SCINTILLATORS AND APPLICATIONS THEREOF

(71) Applicant: Wake Forest University, Winston-Salem, NC (US)

(72) Inventor: Richard T. Williams, Winston-Salem, NC (US)

(73) Assignee: WAKE FOREST UNIVERSITY, Winston-Salem, NC (US)

( * ) Notice: Subject to any disclaimer, the term of this patent is extended or adjusted under 35 U.S.C. 154(b) by 0 days.

(21) Appl. No.: 14/298,020

(22) Filed: Jun. 6, 2014

(65) Prior Publication Data

US 2014/0284498 A1    Sep. 25, 2014

Related U.S. Application Data

(63) Continuation of application No. 13/642,224, filed as application No. PCT/US2011/033041 on Apr. 19, 2011, now Pat. No. 8,779,365.

(60) Provisional application No. 61/325,688, filed on Apr. 19, 2010.

(51) Int. Cl.

| | | |
|---|---|---|
| *G01T 1/202* | (2006.01) | |
| *H01L 31/153* | (2006.01) | |
| *C09K 11/61* | (2006.01) | |
| *C09K 11/77* | (2006.01) | |
| *G21K 4/00* | (2006.01) | |

(52) U.S. Cl.

CPC ............ *G01T 1/2023* (2013.01); *C09K 11/616* (2013.01); *C09K 11/7733* (2013.01); *C09K 11/7772* (2013.01); *G01T 1/202* (2013.01); *G21K 4/00* (2013.01); *H01L 31/153* (2013.01); *G21K 2004/06* (2013.01)

(58) Field of Classification Search

CPC ............ C09K 11/616; C09K 11/7733; C09K 11/7772; G01T 1/202; G01T 1/2023; G21K 2004/06

See application file for complete search history.

(56) References Cited

U.S. PATENT DOCUMENTS

| 8,779,365 B2 | 7/2014 | Williams |
|---|---|---|
| 2007/0254981 A1 | 11/2007 | DiMaio et al. |
| 2007/0267576 A1 | 11/2007 | Loureiro et al. |

(Continued)

FOREIGN PATENT DOCUMENTS

| EP | 1473347 A1 | 11/2004 |
|---|---|---|

(Continued)

OTHER PUBLICATIONS

Yuanfang et al., X-ray luminescence of LaF3: Tb3+ and LaF3: Ce3+, Tb3+ water-soluble nanoparticles, Journal of Applied Physics, Mar. 21, 2008, pp. 063105-063107, vol. 103, No. 6, American Institute of Physics, New York, US.

International Search Report for PCT/US2011/033041 dated Jun. 30, 2011, 3 pages.

*Primary Examiner* — Mark R Gaworecki  
(74) *Attorney, Agent, or Firm* — J. Clinton Wimbish; Smith Moore Leatherwood LLP

(57) ABSTRACT

Scintillators of various constructions and methods of making and using the same are provided. In some embodiments, a scintillator comprises at least one radiation absorption region and at least one spatially discrete radiative exciton recombination region.

20 Claims, 6 Drawing Sheets

(56) References Cited

U.S. PATENT DOCUMENTS

2008/0128624 A1 6/2008 Cooke et al.
2010/0001209 A1 1/2010 Osinski et al.

FOREIGN PATENT DOCUMENTS

| WO | 2007089746 | A1 | 8/2007 |
| WO | 2007120441 | A2 | 10/2007 |
| WO | 2011054050 | A1 | 5/2011 |

SCINTILLATORS AND APPLICATIONS THEREOF

RELATED APPLICATION DATA

The present application is a continuation pursuant to 35 U.S.C. §120 of U.S. patent application Ser. No. 13/642,224 filed Sep. 24, 2013 which claims priority under 35 U.S.C. §119(e) to U.S. Patent Application Ser. No. 61/325,688, filed Apr. 19, 2010, which is hereby incorporated by reference in its entirety.

STATEMENT OF GOVERNMENT LICENSE RIGHTS

This invention was made with Government support under Grant No. DE-AC02-05CH11231 awarded by the United States Department of Energy. The Government has certain rights in the invention.

FIELD OF THE INVENTION

The present invention relates to luminescent materials and, in particular, to scintillators and applications thereof.

BACKGROUND OF THE INVENTION

Scintillators are materials that absorb high-energy radiation (e.g. gamma rays, x-rays, high-energy particles) and emit light (low-energy photons) in response. To the extent that the number of emitted photons is proportional to the total energy of the stopped radiation, a scintillator provides the useful function of identifying the total energy of any radiation that is stopped.

As the nucleus of every element (and each isotope of each element) emits a characteristic fingerprint of gamma-ray energies when suitably excited (usually by neutron activation), scintillator responses to such emissions provide value in security screening of shipping and trucking containers and baggage, where chemical elements and isotopes of elements can be identified (and imaged using arrays of segmented scintillators) without opening the container. This applies both to radioactive elements (nuclear nonproliferation and screening) and to ordinary non-radioactive elements via neutron activation of gamma emission. Scintillators are also widely used in medical imaging and diagnostics as well as oil-well logging, where energy resolution can often also be of value. Desirable energy resolution requires sufficient proportionality of light yield to ray energy. Non-proportionality of scintillator photonic emission to the stopped radiation can degrade resolution and produce significant inaccuracies in determining the total energy of the radiation received.

It is generally accepted that non-proportionality in scintillators is associated with quenching (non-radiative electron-hole recombination) in parts of the particle/ray track wherein ionization density is high, coupled with the characteristic variability of dE/dx from beginning to end of an electron track. Prior scintillators, such as CsI:Tl as well as others, comprise crystalline materials doped with impurities. The impurities serve as radiative recombination centers for electron-hole pairs generated from the absorption of the high energy radiation. Impurities are doped throughout the host crystal to ensure efficient photonic output from the scintillator upon radiation absorption. As a result, an electron-hole pair does not have to travel far before contacting an impurity for radiative recombination. This limitation of carrier mobilities reduces the probability of linear (i.e. trap dominated) non-radiative electron-hole recombination, thereby maximizing the light output of the scintillator. Maximization of light output by this route, however, has associated costs as the limitation of carrier mobility by high dopant levels throughout the host crystal can result in or exacerbate non-proportional response of the scintillator to the absorbed radiation.

SUMMARY

In view of the foregoing, scintillators are described herein which, in some embodiments, may address one or more disadvantages of previous scintillators. In some embodiments, a scintillator described herein comprises at least one radiation absorption or stopping region and at least one spatially discrete radiative exciton recombination region for receiving excitons from the at least one radiation absorption region. In some embodiments, a scintillator described herein comprises a plurality of radiation absorption regions and a plurality of spatially discrete radiative exciton recombination regions for receiving excitons from the plurality of radiation absorption regions.

In some embodiments, a radiative exciton recombination region operable to receive excitons from a radiation absorption region comprises one or more scintillation activators. In some embodiments of a scintillator described herein, a radiation absorption region comprises less scintillation activator than one or more spatially discrete radiative exciton recombination regions. In some embodiments, a radiation absorption region is free or substantially free of scintillation activator.

Exciton(s), as used herein, refers to bound electron-hole pairs as well as free or independent holes and electrons. Additionally, radiation includes electromagnetic radiation, particle radiation, photons, electrons, heavy charged particles, neutrons or combinations thereof. In some embodiments, radiation comprises high energy radiation such as gamma rays, x-rays, other high energy particles or combinations thereof.

In some embodiments, a scintillator described herein comprises a single-crystalline material. In some embodiments, a scintillator described herein comprises a polycrystalline material. In some embodiments, a scintillator described herein is optically transparent or substantially optically transparent.

Moreover, in some embodiments, a radiation absorption region of a scintillator described herein comprises one or more metal halides. In embodiments described herein, a metal halide comprises an alkali halide, an alkaline earth halide or a transition metal halide or mixtures thereof. In some embodiments, a metal halide absorption region of a scintillator comprises less scintillation activator than one or more spatially discrete radiative exciton recombination regions. In some embodiments, a metal halide absorption region of a scintillator is free or substantially free of scintillation activator. In some embodiments, a radiation absorption region of a scintillator described herein comprises a semiconductor material including, but not limited to, II/VI semiconductors and/or III/V semiconductors.

In some embodiments, a spatially discrete radiative exciton recombination region comprises a metal halide having incorporated therein one or more scintillation activators. In some embodiments, scintillation activators comprise transition metals, lanthanide series elements or actinide series elements or combinations thereof. In some embodiments, one or more scintillation activators can comprise dopants, impurities or intrinsic defects within the crystalline structure of the metal halide. In some embodiments, a spatially discrete radiative exciton recombination region comprises a semiconductor material having a bandgap less than the bandgap of a semiconductor material of the radiation absorption region. In some embodiments, a semiconductor material of a spatially discrete radiative recombination region comprises a II/VI semiconductor or a III/V semiconductor.

In another aspect, crystalline particles or grains are provided. In some embodiments, crystalline particles or grains can be sintered to provide a scintillator having a construction described herein. A crystalline particle or grain, in some embodiments, comprises a radiation absorption region comprising at least one metal halide and a spatially discrete radiative exciton recombination region. In some embodiments, the spatially discrete radiative exciton recombination region comprises a metal halide comprising one or more scintillation activators. In some embodiments, a metal halide absorption region comprises less scintillation activator than one or more spatially discrete radiative exciton recombination regions. In some embodiments, a metal halide absorption region is free or substantially free of scintillation activator.

In other embodiments, a crystalline particle or grain comprises at least one radiation absorption region and at least one spatially discrete radiative exciton recombination region, the particle having a size ranging from about 20 nm to about 1 μm. In some embodiments, the at least one radiation absorption region of the crystalline particle comprises a metal halide free or substantially free of a scintillation activator, and the at least one radiative exciton recombination region comprises a metal halide comprising one or more scintillation activators. In some embodiments, the at least one radiation absorption region comprises a first semiconductor having a first bandgap, and the at least one radiative exciton recombination region comprises a second semiconductor having a second bandgap. In some embodiments, the second bandgap is smaller than the first bandgap.

In another embodiment, a scintillation detector or counter is described herein. In some embodiments, a scintillation detector or counter comprises a scintillator and an electromagnetic radiation sensor, wherein the scintillator comprises any construction described herein. In some embodiments, for example, a scintillator of a scintillation detector has a construction comprising at least one radiation absorption region and at least one spatially discrete radiative exciton recombination region comprising a scintillation activator, wherein excitons are received from the at least one radiation absorption region.

In another aspect, methods of making scintillators are described herein. In some embodiments, a method of making a scintillator comprises providing a radiation absorption region comprising a first material having a first bandgap and locally modulating the first bandgap to trap excitons in a spatially discrete radiative exciton recombination region, wherein locally modulating the first bandgap comprises providing the radiative exciton recombination region in electrical communication with the radiation absorption region. In some embodiments, the first material comprises a metal halide and the second material comprises a metal halide having incorporated therein one or more scintillation activators. In some embodiments, the metal halide first material is free or substantially free of scintillation activator.

A method of producing a scintillator, in some embodiments, comprises providing a radiation absorption region comprising a metal halide and providing a spatially discrete radiative exciton recombination region in electrical communication with the radiation absorption region, the radiative exciton recombination region comprising a metal halide comprising one or more scintillation activators. In some embodiments, the metal halide radiation absorption region comprises less scintillation activator than the spatially discrete radiative exciton recombination region. In some embodiments, the metal halide radiation absorption region is free or substantially free of scintillation activator.

In some embodiments, a method of producing a scintillator comprises providing a mixture of metal halide particles and metal halide particles comprising one or more scintillation activators and sintering the particles of the mixture to provide a polycrystalline scintillator. In some embodiments, the polycrystalline scintillator comprises a radiation absorption region formed from sintered metal halide particles free or substantially free of scintillation activator. Moreover, in some embodiments, the polycrystalline scintillator comprises spatially discrete radiative exciton recombination regions formed from the metal halide particles comprising one or more scintillation activators. In some embodiments, for example, metal halide particles comprising one or more scintillation activators are dispersed throughout a sintered matrix of metal halide particles free or substantially free of scintillation activator to provide spatially discrete radiative exciton recombination regions.

In some embodiments, a method of producing a scintillator comprises providing crystalline particles comprising a radiation absorption region and a spatially discrete radiative recombination region and sintering the crystalline particles to provide a polycrystalline scintillator. In some embodiments, the radiation absorption region of a crystalline particle comprises a metal halide free or substantially free of scintillation activator, and the spatially discrete radiative recombination region comprises a metal halide comprising one or more scintillation activators. In some embodiments, the radiation absorption region of a crystalline particle comprises a first semiconductor having a first bandgap, and the spatially discrete radiative recombination region comprises a second semiconductor having a second bandgap. In some embodiments, the second bandgap is less than the first bandgap.

In another aspect, methods of converting radiation of a first energy into radiation of a second energy are described herein. In one embodiment, a method of converting radiation of a first energy into radiation of a second energy comprises providing a scintillator comprising at least one radiation absorption region and at least one spatially discrete radiative exciton recombination region, absorbing the radiation of the first energy in the radiation absorption region to generate excitons and recombining at least some of the excitons in the spatially discrete radiative exciton recombination region to emit radiation of a second energy. In some embodiments, the radiation of the first energy has a wavelength less than the wavelength of the radiation of the second energy. As described herein, in some embodiments, the radiation absorption region of the scintillator comprises a metal halide, and the spatially discrete radiative exciton recombination region comprises a metal halide comprising one or more scintillation activators. In some embodiments, the metal halide radiation absorption region comprises less scintillation activator than one or more spatially discrete radiative exciton recombination regions. In some embodiments, the metal halide radiation absorption region is free or substantially free of scintillation activator.

In a further aspect, methods of reducing non-proportional response in a scintillator are described herein. In one embodiment, a method of reducing non-proportional response comprises providing a scintillator comprising at least one radiation absorption region and at least one spatially discrete radiative exciton recombination region, absorbing radiation of a first energy in the radiation absorption region to generate excitons, transferring at least some of the excitons out of the radiation absorption region and into the spatially discrete radiative exciton recombination region and recombining the excitons to emit radiation of a second energy from the radiative exciton recombination region. In some embodiments, the radiation absorption region of the scintillator comprises a metal halide free or substantially free of a scintillation activator, and the spatially discrete radiative exciton recombination region comprises a metal halide comprising one or more scintillation activators.

These and other embodiments are described in greater detail in the detailed description which follows.

DETAILED DESCRIPTION

The present invention can be understood more readily by reference to the following detailed description and drawings and their previous and following descriptions. Elements, apparatus and methods of the present invention, however, are not limited to the specific embodiments presented in the detailed description and drawings. It should be recognized that these embodiments are merely illustrative of the principles of the present invention. Numerous modifications and adaptations will be readily apparent to those of skill in the art without departing from the spirit and scope of the invention.

As described herein, the present invention provides scintillators and methods of making and using the same. In some embodiments, a scintillator comprises at least one radiation absorption region and at least one spatially discrete radiative exciton recombination region for receiving excitons from the at least one radiation absorption region. In some embodiments, a scintillator comprises a plurality of radiation absorption regions and a plurality of spatially discrete radiative exciton recombination regions for receiving excitons from the plurality of radiation absorption regions.

In keeping radiation absorption and radiative exciton recombination regions spatially discrete, at least some, if not substantially all, excitons generated in one or more radiation absorption regions are transferred to one or more radiative exciton recombination regions for recombination and photonic emission. As described herein, the absence of scintillation activator in the radiation absorption material facilitates transfer of excitons out of the absorption material to the radiative exciton recombination material. A scintillator architecture wherein a radiation absorption or stopping region is spatially discrete from an exciton recombination region is a fundamental departure from prior scintillator constructions wherein radiation absorption and exciton recombination occur in the same region or material. Prior scintillator constructions, for example, utilize a radiation absorption material doped throughout with impurities (scintillation activators) to induce radiative exciton recombination throughout the absorption material.

Figure 1:
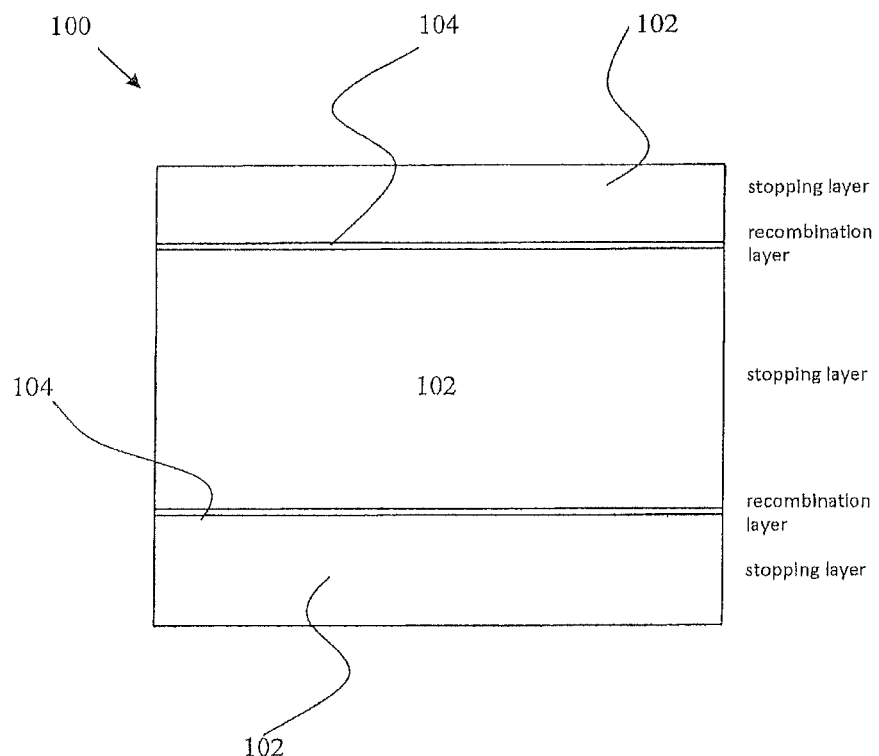
FIG. 1 illustrates spatially discrete radiation absorption and radiative exciton recombination regions of a scintillator according to one embodiment described herein.

FIG. 1 illustrates spatially discrete radiation absorption and radiative exciton recombination regions of a scintillator according to one embodiment described herein. The scintillator (100) illustrated in FIG. 1 comprises a plurality of radiation absorption or stopping regions (102) and a plurality of spatially discrete radiative exciton recombination regions (104). In the embodiment illustrated in FIG. 1, the spatially discrete radiative exciton recombination regions (104) are disposed as continuous layers between layered radiation absorption regions (102). As provided herein, excitons generated in the radiation absorption layers (102) are transferred to the radiative exciton recombination regions (104) for recombination and light emission.

Figure 2:
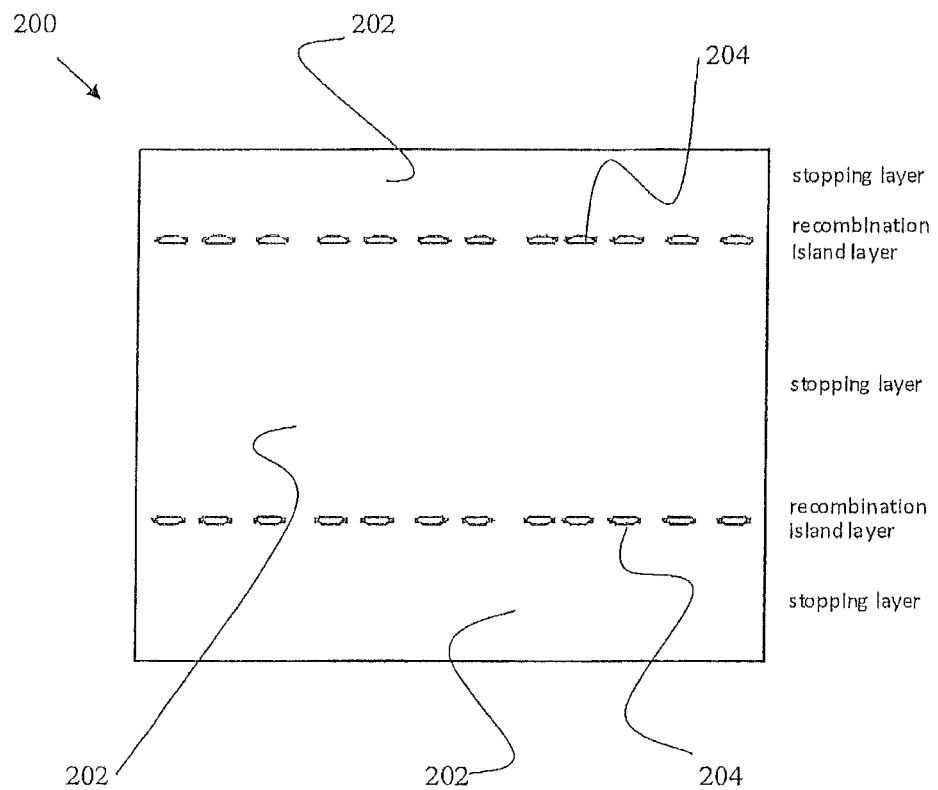
FIG. 2 illustrates spatially discrete radiation absorption and radiative exciton recombination regions of a scintillator according to one embodiment described herein.

FIG. 2 illustrates spatially discrete radiation absorption and radiative exciton recombination regions of a scintillator according to another embodiment described herein. The scintillator illustrated in FIG. 2 comprises a plurality of radiation absorption or stopping regions (202) and a plurality of spatially discrete radiative exciton recombination regions (204). The spatially discrete radiative exciton recombination regions (204) are disposed as discontinuous layers of island structures positioned between layers of radiation absorption regions (202). The use of island structures for spatially discrete radiative exciton recombination regions (204), in some embodiments, permits excitons produced in the radiation absorption regions (202) to be confined in 3-dimensions.

Figure 3:
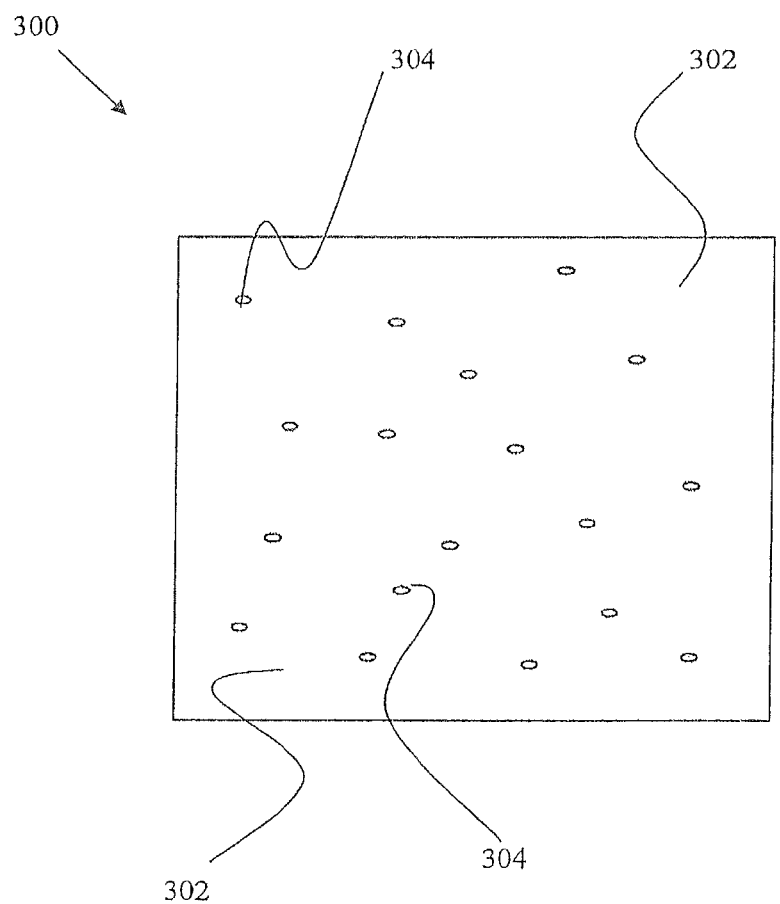
FIG. 3 illustrates spatially discrete radiation absorption and radiative exciton recombination regions of a scintillator according to one embodiment described herein.

FIG. 3 illustrates spatially discrete radiation absorption and radiative exciton recombination regions of a scintillator according to another embodiment described herein. The scintillator illustrated in FIG. 3 comprises a continuous radiation absorption or stopping region (302) and a plurality of spatially discrete radiative exciton recombination regions (304). The spatially discrete radiative exciton recombination regions (304) are island structures disposed in the radiation absorption region (302). In some embodiments, the radiative exciton recombination regions (304) are randomly ordered in and/or dispersed throughout the radiation absorption region (302). In some embodiments, the radiative exciton recombination regions (304) are patterned in the radiation absorption region.

A spatially discrete radiative exciton recombination region, in some embodiments, occupies a fraction of the space or volume occupied by a radiation absorption region. In some embodiments of a layered scintillator, such as that illustrated in FIG. 1 or FIG. 2 herein, the thickness ratio of a radiation absorption region to a radiative exciton recombination region is at least 10. In some embodiments, the thickness ratio of a radiation absorption region to a radiative exciton recombination region is at least 100. The thickness ratio of a radiation absorption region to a radiative exciton recombination region, in some embodiments, is at least 1000. In some embodiments, the thickness ratio of a radiation absorption region to a radiative exciton recombination region is at least 10,000.

In some embodiments, spatially discrete radiative exciton recombination regions of a scintillator described herein have a spacing equal or substantially equal to the diffusion range of the least mobile carriers generated in the radiation absorption region. In some embodiments, spatially discrete radiative exciton recombination regions have a spacing less than the diffusion range of the least mobile carriers generated in the radiation absorption region. In some embodiments, the least mobile carriers generated in the radiation absorption region are holes. In some embodiments, the least mobile charge carriers generated in the radiation absorption region are electrons.

As carrier mobility and carrier diffusion range varies from material to material, spacing of spatially discrete radiative exciton recombination regions can vary depending on the identity of the material of the radiation absorption region. In some embodiments, diffusion range of a carrier of a radiation absorption region is determined according to:

$$r=(Dt)^{0.5}$$

wherein D is the diffusion coefficient of the material forming the radiation absorption region and wherein D is related to carrier mobility (μ) by:

$$D=kT\mu/e$$

wherein k is the Boltzman constant, T is temperature (K) and e is electron charge. With the carrier diffusion range of a radiation absorption region being determined according to the foregoing, the appropriate spacing of spatially discrete exciton recombination regions for a scintillator described herein can be set.

In some embodiments, a radiation absorption region comprises one or more materials having a carrier (hole or electron) mobility of at least about $1 \cdot 10^{-4}$ cm$^2$/V·s. In some embodiments, a material of a radiation absorption region has a carrier mobility of at least about $1 \cdot 10^3$ cm$^2$/V·s or at least about 0.1 cm$^2$/V·s. In some embodiments, a material of a radiation absorption region has a carrier mobility of at least 1 cm$^2$/V·s. In some embodiments, a material of a radiation absorption region has a carrier mobility of at least 100 cm$^2$/V·s or at least 1000 cm$^2$/V·s.

In some embodiments, a material of a radiation absorption region has a carrier mobility ranging from about $1 \cdot 10^{-4}$ cm$^2$/V·s to about 1000 cm$^2$/V·s. In some embodiments, a material of a radiation absorption region has a carrier mobility ranging from about $1 \cdot 10^{-2}$ cm$^2$/V·s to about 100 cm$^2$/V·s. In some embodiments, a material of a radiation absorption region has a carrier mobility ranging from about 0.1 cm$^2$/V·s to about 70 cm$^2$/V·s or from about 1 cm$^2$/V·s to about 50 cm$^2$/V·s. In some embodiments, a material of a radiation absorption region has a carrier mobility ranging from about 5 cm$^2$/V·s to about 100 cm$^2$/V·s or from about 10 cm$^2$/V·s to about 75 cm$^2$/V·s. In some embodiments, a material of a radiation absorption region has a carrier mobility ranging from about 20 cm$^2$/V·s to about 80 cm$^2$/V·s.

I. Metal Halide Scintillator

In some embodiments, a scintillator described herein comprises at one radiation absorption region comprising a metal halide and at least one spatially discrete radiative exciton recombination region comprising a metal halide comprising one or more scintillation activators. In some embodiments, the metal halide of the radiation absorption region is free or substantially free of scintillation activator, thereby promoting the transfer of one or more photo-generated charge carriers or excitons to a spatially discrete radiative exciton recombination region for recombination and photonic emission.

A. Alkali Halide Scintillators

In some embodiments, metal halides suitable for use as the radiation absorption region of a scintillator described herein comprise alkali halides. In some embodiments, for example, a radiation absorption region comprises cesium iodide (CsI), sodium iodide (NaI) or potassium iodide (KI). In some embodiments, an alkali halide radiation absorption region comprises less scintillation activator than an alkali halide spatially discrete radiative exciton recombination region described herein. In some embodiments, an alkali halide radiation absorption region is free or substantially free of scintillator.

Moreover, in some embodiments, metal halides suitable for use in a spatially discrete radiative exciton recombination region comprise alkali halides comprising one or more scintillation activators associated therewith. In some embodiments, a spatially discrete radiative exciton recombination region comprises CsI, NaI or KI comprising one or more scintillation activators. In some embodiments, a spatially discrete radiative exciton recombination region and a radiation absorption region comprise the same alkali halide. In some embodiments, a spatially discrete radiative exciton recombination region and a radiation absorption region comprise different alkali halides. In some embodiments comprising different alkali halides, the alkali halide of the spatially discrete radiative exciton recombination region has a lower bandgap than the alkali halide of the radiation absorption region. In some embodiments wherein the alkali halide of the spatially discrete radiative exciton recombination region has a lower bandgap, the alkali halide of the recombination region does not comprise a scintillation activator.

As described herein, scintillation activators can comprise transition metals, lanthanide series elements, actinide series elements, alkali metals, impurities, intrinsic crystalline defects or combinations thereof. In some embodiments, a scintillation activator of an alkali halide comprises thallium (Tl$^+$) or sodium (Na$^+$)

An alkali halide spatially discrete radiative exciton recombination region can comprise any amount of scintillation activator not inconsistent with the objectives of the present invention. In some embodiments, an alkali halide spatially discrete radiative exciton recombination region comprises one or more scintillation activators in an amount of at least about 0.1 mol %. In some embodiments, an alkali halide spatially discrete radiative exciton recombination region comprises one or more scintillation activators in an amount of at least about 0.3 mol %. In some embodiments, an alkali halide spatially discrete radiative exciton recombination region comprises one or more scintillation activators in an amount of at least about 0.5 mol %. In some embodiments, an alkali halide spatially discrete radiative exciton recombination region comprises one or more scintillation activators in an amount ranging from about 0.1 mol % to about 1 mol %.

In some embodiments, spatially discrete radiative exciton recombination regions are incorporated into a single crystal radiation absorption host of an alkali halide. In some embodiments described further herein, spatially discrete radiative exciton recombination regions are provided as alkali halide particles doped with one or more scintillation activators. The doped alkali halide particles are mixed with undoped alkali halide particles and co-sintered to provide a polycrystalline scintillator material, wherein the undoped alkali halide particles form one or more radiation absorption regions of the polycrystalline scintillator. Additionally, in some embodiments described further herein, alkali halide particles comprising at least one radiation absorption region and at least one spatially discrete radiative exciton recombination region are provided and sintered resulting in a polycrystalline scintillator.

Moreover, in some embodiments of a scintillator described herein having a radiation absorption region comprising an alkali halide, the spatially discrete radiative exciton recombination regions have a spacing of up to about 40 nm. In some embodiments, the spatially discrete radiative exciton recombination regions have spacing of up to about 30 nm or 20 nm. In some embodiments, the spatially discrete radiative exciton recombination regions have a spacing ranging from about 1 nm to about 40 nm or from about 5 nm to about 30 nm. In some embodiments, the spatially discrete radiative exciton recombination regions have a spacing ranging from about 10 nm to about 20 nm.

B. Alkaline Earth Halide Scintillators

In some embodiments, metal halides suitable for use as the radiation absorption region of a scintillator described herein comprise alkaline earth halides. In some embodiments, for example, a radiation absorption region comprises strontium iodide ($SrI_2$), barium iodide ($BaI_2$) or barium bromide iodide (BaBrI). In some embodiments, an alkaline earth halide radiation absorption region comprises less scintillation activator than an alkaline earth halide spatially discrete radiative exciton recombination region described herein. In some embodiments, an alkaline earth halide radiation absorption region is free or substantially free of scintillator.

Additionally, in some embodiments, metal halides suitable for use in a spatially discrete radiative exciton recombination region comprise alkaline earth halides comprising one or more scintillation activators associated therewith. In some embodiments, a spatially discrete radiative exciton recombination region comprises $SrI_2$, $BaI_2$ or BaBrI comprising one or more scintillation activators. In some embodiments, a spatially discrete radiative exciton recombination region and a radiation absorption region comprise the same alkaline earth halide. In some embodiments, a spatially discrete radiative exciton recombination region and a radiation absorption region comprise different alkaline earth halides. In some embodiments comprising different alkaline earth halides, the alkaline earth halide of the spatially discrete radiative exciton recombination region has a lower bandgap than the alkaline earth halide of the radiation absorption region. In some embodiments wherein the alkaline earth halide of the spatially discrete radiative exciton recombination region has a lower bandgap, the alkaline earth halide of the recombination region does not comprise a scintillation activator.

As described herein, scintillation activators can comprise transition metals, lanthanide series elements, actinide series elements, alkali metals, impurities, intrinsic crystalline defects or combinations thereof. In some embodiments, a scintillation activator of an alkali earth halide comprises europium ($Eu^{2+}$).

An alkaline earth halide spatially discrete radiative exciton recombination region can comprise any amount of scintillation activator not inconsistent with the objectives of the present invention. In some embodiments, an alkaline earth halide spatially discrete radiative exciton recombination region comprises one or more scintillation activators in an amount of at least about 0.1 mol %. In some embodiments, an alkaline earth halide spatially discrete radiative exciton recombination region comprises one or more scintillation activators in an amount of at least about 0.3 mol %. In some embodiments, an alkaline earth halide spatially discrete radiative exciton recombination region comprises one or more scintillation activators in an amount of at least about 0.5 mol %. In some embodiments, an alkaline earth halide spatially discrete radiative exciton recombination region comprises one or more scintillation activators in an amount ranging from about 0.1 mol % to about 10 mol % or from about 1 mol % to about 10 mol %. In some embodiments, an alkaline earth halide spatially discrete radiative exciton recombination region comprises one or more scintillation activators in an amount ranging from about 2 mol % to about 8 mol % or from about 3 mol % to about 7 mol %.

In some embodiments, spatially discrete radiative exciton recombination regions are incorporated into a single crystal radiation absorption host of an alkaline earth halide. In some embodiments described further herein, spatially discrete radiative exciton combination regions are provided as alkaline earth halide particles doped with one or more scintillation activators. The doped alkaline earth halide particles are mixed with undoped alkaline earth halide particles and co-sintered to provide a polycrystalline scintillator material, wherein the undoped alkaline earth halide particles form one or more radiation absorption regions of the polycrystalline scintillator. Additionally, in some embodiments described further herein, alkaline earth halide particles comprising at least one radiation absorption region and at least one spatially discrete radiative exciton recombination region are provided and sintered resulting in a polycrystalline scintillator.

In some embodiments of a scintillator described herein having a radiation absorption region comprising an alkaline earth halide, the spatially discrete radiative exciton recombination regions have a spacing of up to about 500 nm. In some embodiments, the spatially discrete radiative exciton recombination regions have spacing of up to about 200 nm or 100 nm. In some embodiments, the spatially discrete radiative exciton recombination regions have a spacing ranging from about 10 nm to about 500 nm or from about 50 nm to about 200 nm. In some embodiments, the spatially discrete radiative exciton recombination regions have a spacing ranging from about 5 nm to about 200 nm or from about 10 nm to about 100 nm.

C. Transition Metal Halide Scintillators

In some embodiments, metal halides suitable for use as the radiation absorption region of a scintillator described herein comprise transition metal halides. In some embodiments, for example, a radiation absorption region comprises a transition metal halide, wherein the metal is selected from the group consisting of metallic elements of Groups IB, IIB, IIIB, IIIA, IVA and VA of the Periodic Table. Groups of the Periodic Table described herein are identified according to the CAS designation. In some embodiments, for example, the radiation absorption region comprises a lanthanum halide, copper halide, zinc halide, cadmium halide, mercury halide, indium halide, thallium halide, tin halide or a lead halide. In some embodiments, the radiation absorption region comprises $LaBr_3$, $LaCl_3$, CuI, $ZnI_2$, $CdI_2$, $HgI_2$, InI, TlI, $SnI_4$ or $PbI_2$.

In some embodiments, a transition metal halide radiation absorption region comprises less scintillation activator than a transition metal halide spatially discrete radiative exciton recombination region described herein. In some embodiments, a transition metal halide radiation absorption region is free or substantially free of scintillator.

In some embodiments, a spatially discrete radiative exciton recombination region and a radiation absorption region comprise the same transition metal halide. In some embodiments, a spatially discrete radiative exciton recombination region and a radiation absorption region comprise different transition metal halides. In some embodiments comprising different transition metal halides, the transition metal halide of the spatially discrete radiative exciton recombination region has a lower bandgap than the transition metal halide of the radiation absorption region. In some embodiments wherein the transition metal halide of the spatially discrete radiative exciton recombination region has a lower bandgap, the transition metal halide of the recombination region does not comprise a scintillation activator.

In some embodiments, metal halides suitable for use in a spatially discrete radiative exciton recombination region comprise transition metal halides comprising one or more scintillation activators associated therewith. In some embodiments, for example, a spatially discrete radiative exciton recombination region comprises a transition metal halide comprising one or more scintillation activators, wherein the transition metal is selected from the group consisting of metallic elements of Groups IB, IIB, IIIB, IIIA, IVA and VA of the Periodic Table. In some embodiments, a spatially discrete radiative exciton recombination region comprises a lanthanum halide, copper halide, zinc halide, cadmium halide, mercury halide, indium halide, thallium halide, tin halide or a lead halide. In some embodiments, the radiation absorption region comprises $LaBr_3$, $LaCl_3$, $CuI$, $ZnI_2$, $CdI_2$, $HgI_2$, $InI$, $TlI$, $SnI_4$ or $PbI_2$ comprising one or more scintillation activators. In some embodiments, a spatially discrete radiative exciton recombination region and a radiation absorption region comprise the same transition metal halide. In some embodiments, a spatially discrete radiative exciton recombination region and a radiation absorption region comprise different transition halides.

As described herein, scintillation activators can comprise transition metals, lanthanide series elements, actinide series elements, alkali metals, impurities, intrinsic crystalline defects or combinations thereof. In some embodiments, a scintillation activator comprises cerium ($Ce^{3+}$) for use in a lanthanum halide (e.g. $LaBr_3$ or $LaCl_3$) exciton recombination region. In some embodiments, cerium can be present in a spatially discrete lanthanum halide exciton recombination region in an amount ranging from about 0.1 mol % to about 30 mol %. In some embodiments, a scintillation activator comprises one or more impurities and/or defects in the crystalline structure of a transition metal halide of a spatially discrete recombination region.

In some embodiments, spatially discrete radiative exciton recombination regions are incorporated into a single crystal radiation absorption host of a transition metal halide. In some embodiments described further herein, spatially discrete radiative exciton recombination regions are provided as transition metal halide particles having one or more scintillation activators. These transition metal halide particles are mixed with transition metal halide particles substantially free of scintillation activator and co-sintered to provide a polycrystalline scintillator material, wherein the activator free transition metal halide particles form one or more radiation absorption regions of the polycrystalline scintillator. Additionally, in some embodiments described further herein, transition metal halide particles comprising at least one radiation absorption region and at least one spatially discrete radiative exciton recombination region are provided and sintered resulting in a polycrystalline scintillator.

In some embodiments of a scintillator described herein having a radiation absorption region comprising a transition metal halide, the spatially discrete radiative exciton recombination regions have a spacing of up to about 5 μm. In some embodiments, the spatially discrete radiative exciton recombination regions have a spacing ranging from about 10 nm to about 5 μm or from about 100 nm to about 1 μm. In some embodiments, the spatially discrete radiative exciton recombination regions have a spacing ranging from about 250 nm to about 750 nm.

II. Polycrystalline Scintillators

In another aspect, polycrystalline scintillators are described herein. In some embodiments, a scintillator comprises a polycrystalline material, the polycrystalline material having at least one radiation absorption region and at least one spatially discrete radiative exciton recombination region. In some embodiments, the polycrystalline material of a scintillator comprises a plurality of radiation absorption regions and/or a plurality of spatially discrete radiative exciton recombination regions.

In some embodiments, the at least one radiation absorption region comprises one or more crystalline grains free or substantially free of scintillation activator. Moreover, in some embodiments, the at least one spatially discrete radiative exciton recombination region comprises one or more crystalline grains comprising a scintillation activator. In some embodiments, one or more spatially discrete radiative recombination regions of a polycrystalline scintillator comprises more scintillation activator than a radiation absorption region.

In some embodiments, crystalline grains comprising scintillation activator are present in a polycrystalline scintillator described herein in an amount of up to about 30 weight percent. In some embodiments, crystalline grains comprising scintillation activator are present in an amount ranging from about 0.01 weight percent to about 30 weight percent or from about 0.1 weight percent to about 20 weight percent. In some embodiments, crystalline grains comprising scintillation activator are present in an amount ranging from about 1 weight percent to about 10 weight percent.

In some embodiments wherein a radiation absorption region comprises crystalline grains and spatially discrete radiative exciton recombination regions comprise crystalline grains, the polycrystalline scintillator material is a sintered material. In some embodiments, for example, crystalline grains of a radiation absorption region form a sintered host matrix in which crystalline grains comprising scintillation activator are dispersed. The dispersed crystalline grains comprising scintillation activator provide the spatially discrete radiative exciton recombination regions.

In some embodiments, a polycrystalline scintillator material described herein has a density of at least about 95% of theoretical density (i.e., the density of a single crystal). In some embodiments, a polycrystalline scintillator material described herein has a density of at least about 97%. In some embodiments, a polycrystalline scintillator described herein has a density of at least about 99%.

In some embodiments, crystalline grains of a radiation absorption region and crystalline grains of spatially discrete radiative exciton recombination regions comprise one or more alkali halides as set forth in section IA hereinabove. In some embodiments, alkali halide crystalline grains of a radiation absorption region have an average size less than about 40 nm. In some embodiments, alkali halide crystalline grains of a radiation absorption region have an average size ranging from about 1 nm to about 40 nm or from about 10 nm to about 20 nm.

In some embodiments, crystalline grains of a radiation absorption region and crystalline grains of spatially discrete radiative exciton recombination regions comprise one or more alkaline earth halides as set forth in section IB hereinabove. In some embodiments, crystalline grains of one or more alkaline earth halides have a non-cubic crystalline structure. In some embodiments, alkaline earth halides for use in a polycrystalline scintillator demonstrate an orthorhombic crystalline structure. In some embodiments, for example, $SrI_2$, $BaI_2$ and $BaBrI$ demonstrate orthorhombic crystalline structures.

In some embodiments, alkali earth halide crystalline grains of a radiation absorption region have an average size less than about 500 nm. In some embodiments, alkaline earth halide crystalline grains of a radiation absorption region have an average size ranging from about 10 nm to about 500 nm or from about 50 nm to about 200 nm. In some embodiments, alkaline earth halide crystalline grains of a radiation absorption region have an average size ranging from about 10 nm to about 100 nm.

In some embodiments, crystalline grains of a radiation absorption region and crystalline grains of spatially discrete radiative exciton recombination regions comprise one or more transition metal halides as set forth in section IC hereinabove. In some embodiments, crystalline grains of one or more transition metal halides have a cubic crystalline structure. In some embodiments, crystalline grains of one or more transition metal halides have a non-cubic crystalline structure. In some embodiments, transition metal halides for use in a polycrystalline scintillator demonstrate a tetragonal or rhombohedral crystalline structure. In some embodiments, for example, $SnI_4$ and $PbI_2$ demonstrate rhombohedral crystalline structures.

In some embodiments, transition metal halide crystalline grains of a radiation absorption region have an average size less than about 5 μm. In some embodiments, transition metal halide crystalline grains of a radiation absorption region have an average size ranging from about 10 nm to about 5 μm or from about 100 nm to about 1 μm. In some embodiments, transition metal halide crystalline grains of a radiation absorption region have an average size ranging from about 250 nm to about 750 nm.

In some embodiments, crystalline grains of a radiation absorption region and crystalline grains of spatially discrete radiative exciton recombination regions comprise one or more semiconductor materials. In some embodiments, crystalline grains of a radiation absorption region comprises a first semiconductor having a first bandgap, and crystalline grains of spatially discrete radiative exciton recombination regions comprise a second semiconductor having a second bandgap, wherein the first bandgap is greater than the second bandgap.

In some embodiments, the first and/or second semiconductor material comprises a binary semiconductor. Binary semiconductors, in some embodiments, comprise II/VI semiconductors, III/V semiconductors or combinations thereof. In some embodiments, the first and/or second semiconductor material comprises ternary or quaternary semiconductor alloys. Ternary or quaternary semiconductor alloys, in some embodiments, comprise III/V alloys, II/VI alloys or combinations thereof.

In some embodiments, semiconductor crystalline grains of a radiation absorption region have an average size of less than about 100 μm. In some embodiments, semiconductor crystalline grains of a radiation absorption region have an average size ranging from about 10 nm to about 10 μm or from about 50 nm to about 1 μm. In some embodiments, semiconductor crystalline grains of a radiation absorption region have an average size ranging form about 100 nm to about 750 nm.

In some embodiments, a method of producing a polycrystalline scintillator comprises providing a mixture comprising metal halide particles free or substantially free of one or more scintillation activators and metal halide particles comprising one or more scintillation activators and sintering the mixture to provide a polycrystalline scintillator material comprising a radiation absorption region and spatially discrete radiative exciton recombination regions. In some embodiments, the radiation absorption region is formed from the metal halide particles free or substantially free of scintillation activator. In some embodiments, spatially discrete radiative exciton recombination regions are formed by metal halide particles comprising one or more scintillation activators. Metal halide particles suitable for use in methods of forming a polycrystalline scintillator can comprise any metal halide described herein.

In some embodiments, metal halide particles comprising one or more scintillation activators are present in the mixture in an amount up to about 30 weight percent. In some embodiments, metal halide particles comprising scintillation activator are present in the mixture in an amount ranging from about 0.01 weight percent to about 30 weight percent or from about 0.1 weight percent to about 20 weight percent. In some embodiments, metal halide particles comprising scintillation activator are present in the mixture an amount ranging from about 1 weight percent to about 10 weight percent.

The mixture of metal halide particles can be sintered under any conditions of temperature, pressure and time effective to provide a sintered polycrystalline scintillator having a construction described herein. Sintering conditions can be determined according to several factors including specific identity of the metal halide, particle size and particle shape.

In some embodiments, for example, metal halide particles are sintered at a temperature below the melting point of the particles. In some embodiments, metal halide particles described herein are sintered at a temperature ranging from about 30° C. to about 650° C. In some embodiments, sintering temperature can be ramped at any desired rate. In some embodiments, the temperature is ramped at a rate ranging from about 1° C./min to about 10° C./min.

Moreover, in some embodiments, metal halide particles are pressed or subjected to the application of an external pressure prior to and/or during sintering. In some embodiments, metal halide particles are sintered under a pressure ranging from about 1 kpsi to about 200 kpsi. In some embodiments, the external pressure is applied uniaxially. In some embodiments, the pressure is applied isostatically. In some embodiments, metal halide particles are sintered for a time period ranging from about 0.5 to 10 hours. In some embodiments, metal halide particles are sintered for a time period ranging from about 1 hour to about 6 hours. Additionally, in some embodiments, metal halide particles are sintered under vacuum conditions or in an inert, dry atmosphere to prevent water absorption by hygroscopic metal halides.

In some embodiments, a method of producing a polycrystalline scintillator comprises providing a mixture comprising particles of a first semiconductor having a first bandgap and particles of a second semiconductor having a second bandgap and sintering the mixture to provide a polycrystalline scintillator material comprising a radiation absorption region and spatially discrete radiative exciton recombination regions. In some embodiments, the first bandgap is larger than the second bandgap.

In some embodiments, the radiation absorption region is formed from the first semiconductor particles and the spatially discrete radiative exciton recombination regions are formed by the second semiconductor particles. Semiconductor particles suitable for use in methods of forming a polycrystalline scintillator can comprise any semiconductor described herein. Moreover, a mixture comprising particles of a first semiconductor and a second semiconductor can be sintered according to the principles set forth hereinabove for sintering a mixture of metal halide particles.

III. Crystalline Particles

In another aspect, crystalline particles or grains are described herein. In some embodiments, a crystalline particle or grain comprises a radiation absorption region comprising at least one metal halide and a spatially discrete radiative exciton recombination region. In some embodiments, the spatially discrete radiative exciton recombination region comprises a metal halide comprising one or more scintillation activators. In some embodiments, the metal halide radiation absorption region of a crystalline particle described herein has less scintillation activator than the spatially discrete radiative exciton recombination region. In some embodiments, the metal halide radiation absorption region of a crystalline particle described herein is free or substantially free of scintillation activator.

In other embodiments, a crystalline particle described herein comprises at least one radiation absorption region and at least one spatially discrete radiative exciton recombination region, the particle having a size ranging from about 20 nm to about 100 µm. In some embodiments, the crystalline particle has a size ranging from about 50 nm to about 100 µm or from about 100 nm to about 100 µm. In some embodiments, the crystalline particle has a size ranging from about 200 nm to about 50 µm.

In some embodiments, the spatially discrete radiative exciton recombination region of a crystalline particle described herein is disposed between the radiation absorption region and an exterior surface of the crystalline particle. In some embodiments, for example, the spatially discrete radiative exciton recombination region is located at the periphery of the crystalline particle surrounding a core comprising the radiation absorption region. In some embodiments, a crystalline particle comprises a core radiation absorption region and a spatially discrete shell radiative exciton recombination region.

Figure 4:
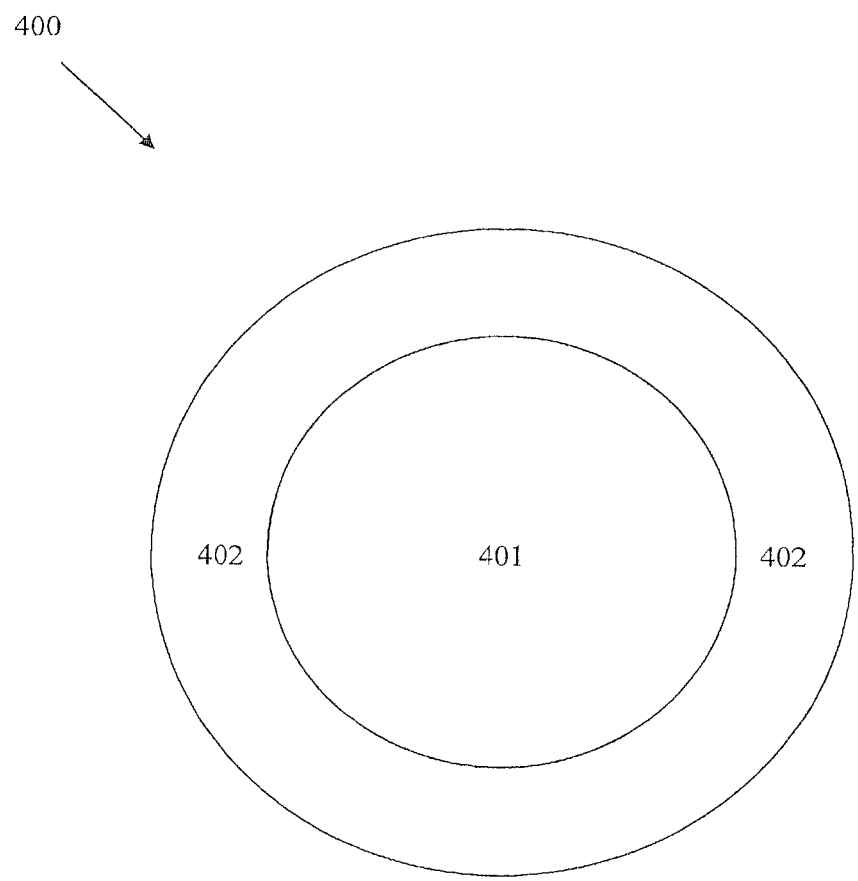
FIG. 4 illustrates a crystalline particle according to one embodiment described herein.

FIG. 4 illustrates a cross-sectional view of a crystalline particle according to one embodiment described herein. As illustrated in FIG. 4, the crystalline particle (400) comprises a radiation absorption core (401) and a spatially discrete radiative exciton recombination shell (402) at least partially surrounding the core (401). In some embodiments, the spatially discrete radiative exciton recombination shell (402) completely or substantially completely surrounds the core (401). As described herein, excitons generated by the absorption of radiation by the core (401) are transferred to the spatially discrete shell (402) for radiative recombination and the release of photons.

In some embodiments wherein the spatially discrete radiative exciton recombination region is disposed between the radiation absorption region and an exterior surface of the crystalline particle, an exciton confinement region or layer can be provided adjacent to the spatially discrete radiative exciton recombination region. In some embodiments, an exciton confinement layer can preclude or inhibit excitons transferred to a spatially discrete radiative exciton recombination region from undergoing non-radiative recombination at particle surface traps and/or surface defects. Moreover, in some embodiments, an exciton confinement region adjacent to a spatially discrete radiative exciton recombination region of a crystalline particle can protect the recombination region from damage during sintering of the crystalline particle as described herein. In some embodiments, an exciton confinement region has a bandgap higher than the bandgap of the material forming the spatially discrete radiative exciton recombination region. In some embodiments, an exciton confinement region can comprise the same material as the core radiation absorption region. In some embodiments, an exciton confinement region is a different material than the core radiation absorption region.

Figure 5:
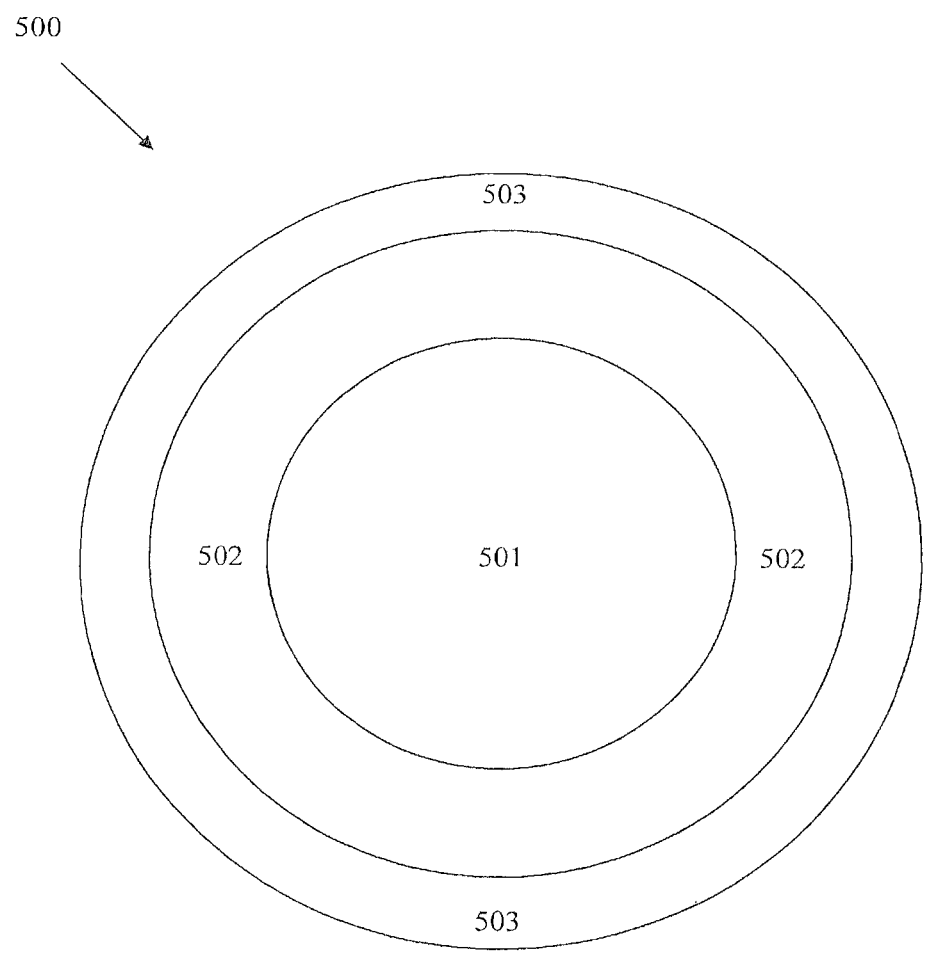
FIG. 5 illustrates a crystalline particle according to one embodiment described herein.

FIG. 5 illustrates a cross-sectional view of a crystalline particle comprising an exciton confinement region adjacent to a spatially discrete radiative exciton recombination region according to one embodiment described herein. As illustrated in FIG. 5, the crystalline particle (500) comprises a radiation absorption core (501) and a spatially discrete radiative exciton recombination shell (502) at least partially surrounding the core (501). In some embodiments, the spatially discrete radiative exciton recombination shell (502) completely or substantially completely surrounds the core (501). As described herein, excitons generated by the absorption of radiation by the core (501) are transferred to the spatially discrete shell (502) for radiative recombination and the release of photons. An exciton confinement region or layer (503) is disposed adjacent to and at least partially surrounds the spatially discrete radiative exciton recombination shell (502). In some embodiments, the exciton confinement region (503) completely or substantially completely surrounds the spatially discrete radiative exciton recombination shell (502).

While the particles illustrated in FIGS. 4 and 5 are spherical, crystalline particles described herein can have any shape including spherical, substantially spherical, non-spherical, elliptical or polygonal.

In some embodiments, the radiation absorption core can comprise any metal halide described herein free or substantially free of scintillation activator. In some embodiments wherein the radiation absorption core comprises an alkali halide described herein, the core has a size less than about 40 nm. In some embodiments, an alkali halide core has a size ranging from about 1 nm to about 40 nm or from about 5 nm to about 30 nm. In some embodiments, an alkali halide core has a size ranging from about 10 nm to about 20 nm.

In some embodiments wherein the core comprises an alkaline earth halide, the core has a size less than about 500 nm. In some embodiments, an alkaline earth halide core has a size ranging from about 10 nm to about 500 nm or from about 50 nm to about 200 nm. In some embodiments, an alkaline earth halide core has a size ranging from about 250 nm to about 750 nm. In some embodiments, an alkaline earth halide core has a size ranging from about 10 nm to abut 100 nm or from about 20 nm to about 80 nm In some embodiments, wherein the core comprises a transition metal halide, the core has a size less than about 5 µm or less than about 1 µm. In some embodiments, a transition metal halide core has a size ranging from about 100 nm to about 5 µm or from about 200 nm to about 1 µm. In some embodiments, a transition metal halide core has a size ranging from about 250 nm to about 750 nm In some embodiments, the radiation absorption core can comprise any semiconductor material described herein. In some embodiments wherein the core comprises a semiconductor material, core has a size less than about 100 µm. In some embodiments, a semiconductor core has a size ranging from about 20 nm to about 10 µm or from about 50 nm to about 1 µm. In some embodiments, a semiconductor core has a size ranging from about 100 nm to about 750 nm.

In some embodiments of a crystalline particle, the spatially discrete radiative exciton recombination shell can comprise any metal halide described herein comprising one or more scintillation activators. In some embodiments, the spatially discrete radiative exciton recombination shell comprises an alkali halide having one or more scintillation activators described herein. In some embodiments wherein the spatially discrete radiative exciton recombination shell comprises an alkali halide having scintillation activator, the shell has a thickness up to about 5 nm. In some embodiments, an alkali halide shell has a thickness ranging from about 1 nm to about 5 nm or from about 2 nm to about 4 nm.

In some embodiments, the spatially discrete radiative exciton recombination shell comprises any alkaline earth halide described herein having one or more scintillation activators. In some embodiments wherein the spatially discrete radiative exciton recombination shell comprises an alkaline earth halide having scintillation activator, the shell has a thickness up to about 10 nm. In some embodiments, an alkaline earth halide shell has a thickness ranging from about 1 nm to about 10 nm or from about 3 nm to about 7 nm.

In some embodiments, the spatially discrete radiative exciton recombination shell comprises any transition metal halide described herein having one or more scintillation activators. In some embodiments wherein the spatially discrete radiative exciton recombination shell comprises a transition metal halide having scintillation activator, the shell has a thickness up to about 100 nm. In some embodiments, a transition metal halide shell has a thickness ranging from about 1 nm to about 100 nm or from about 5 nm to about 75 nm. In some embodiments, a transition metal halide shell has a thickness ranging from about 10 nm to about 50 nm.

In some embodiments, the spatially discrete radiative exciton recombination shell comprises a semiconductor material described herein having a bandgap less than the bandgap of the core semiconductor material. In some embodiments wherein the shell comprises a semiconductor material, the shell has a thickness up to about 1 μm. In some embodiments, a semiconductor shell has a thickness ranging from about 5 nm to about 1 μm or from about 10 nm to about 500 nm.

A crystalline particle having a spatially discrete radiative exciton recombination region located at the periphery of the crystalline particle surrounding a radiation absorption core region can be produced according to several methods. In some embodiments, a metal halide particle can be doped at the periphery of the particle with one or more scintillation activators to provide the spatially discrete radiative exciton recombination shell region and an undoped radiation absorption core region. In one embodiment, for example, a $SrI_2$ particle can be doped at the periphery with $Eu^{2+}$ activator to provide the spatially discrete radiative exciton recombination shell and an undoped $SrI_2$ radiation absorption core. In such embodiments, the crystalline particle can demonstrate a gradient of scintillation activator wherein the amount of scintillation activator increases with increasing distance from the particle center or core.

In some embodiments, a crystalline particle comprising a radiation absorption core and a spatially discrete radiative exciton recombination shell can be produced by providing host particles and diffusing scintillation activator into the host particles to a depth corresponding to the desired thickness of the spatially discrete radiative exciton recombination shell. In one embodiment, for example, particles of $SrI_2$ are provided and placed in an oven or furnace at elevated temperature. A vapor comprising scintillation activator, such as $Eu^{2+}$, can be flowed over the $SrI_2$ particles at a temperature and time period sufficient to diffuse the scintillation activator into the $SrI_2$ particles to the desired depth, thereby establishing a radiation absorption core and a spatially discrete radiative exciton recombination shell.

Alternatively, in some embodiments, a crystalline particle can be produced by providing a metal halide particle free or substantially free of scintillation activator and coating the metal halide particle with a composition comprising scintillation activator. In such embodiments, the coating can serve as the spatially discrete radiative exciton recombination region and the metal halide particle can serve as the radiation absorption region. In some embodiments, for example, metal halide host particles are provided and exposed to vapor comprising precursors of the metal halide host and one or more scintillation activators to deposit a metal halide/scintillation activator coating on the host particles. In some embodiments, such depositions can be administered in chemical vapor deposition (CVD) apparatus or carried out in solution phase in liquid phase epitaxy apparatus.

In some embodiments wherein the radiation absorption region comprises a first semiconductor, a spatially discrete radiative exciton recombination region comprising a second semiconductor can be deposited on the first semiconductor. In some embodiments, the second semiconductor is grown on the first semiconductor by one or more epitaxial methods such as chemical vapor deposition (CVD), atomic layer epitaxy (ALE), solution atomic layer epitaxy (SALE) or molecular beam epitaxy (MBE).

In some embodiments, the foregoing construction of a crystalline particle can be reversed wherein the spatially discrete radiative exciton recombination region is provided as the particle core, and the radiation absorption region is disposed at the periphery of the particle at least partially surrounding the core. In some embodiments, the radiation absorption region is provided as a shell around a spatially discrete radiative exciton recombination core.

In some embodiments, crystalline particles described in this section (section III) of the application can be sintered to provide a polycrystalline scintillator material having at least one radiation absorption region and at least one spatially discrete radiative exciton recombination region. In some embodiments, the construction of the crystalline particles provides the polycrystalline scintillator a plurality of radiation absorption regions and a plurality of spatially discrete radiative exciton recombination regions.

In some embodiments, a method of producing a scintillator comprises providing crystalline particles comprising a radiation absorption region and a spatially discrete radiative exciton recombination region and sintering the crystalline particles to provide a polycrystalline scintillator material. The crystalline particles sintered to provide the polycrystalline scintillator material can have any construction described in this section (section III) of the application.

The crystalline particles can be sintered under any conditions of temperature, pressure and time effective to provide a sintered polycrystalline scintillator having a construction described herein. Sintering conditions can be determined according to several factors including specific identity of the metal halide or semiconductor material, particle size and particle shape. Moreover, sintering should be administered at temperature that does not induce substantial migration or diffusion of scintillation activator out of a spatially discrete radiative exciton recombination region and into the radiation absorption region.

In some embodiments, for example, crystalline particles comprising a radiation absorption region and a spatially discrete radiative exciton recombination region are sintered at a temperature below the melting point of the particles. In some embodiments, metal halide crystalline particles described herein are sintered at a temperature ranging from about 30° C. to about 650° C. In some embodiments, sintering temperature can be ramped at any desired rate. In some embodiments, the temperature is ramped at a rate ranging from about 1° C./min to 10° C./min.

Moreover, in some embodiments, crystalline particles are pressed or subjected to the application of an external pressure during sintering. In some embodiments, crystalline particles are sintered under a pressure ranging from about 1 kpsi to about 200 kpsi. In some embodiments, the external pressure is applied uniaxially. In some embodiments, the pressure is applied isostatically. In some embodiments, crystalline particles are sintered for a time period ranging from about 0.5 to 10 hours. In some embodiments, crystalline particles are sintered for a time period ranging from about 1 hour to about 6 hours. Additionally, in some embodiments, crystalline particles are sintered under vacuum conditions or in an inert, dry atmosphere to prevent water absorption by hygroscopic metal halides.

In some embodiments, the resulting polycrystalline scintillator material has a density of at least about 97% or at least about 99%.

IV. Scintillation Detector

In another embodiment, the present invention provides a scintillation detector or counter comprising and an electromagnetic radiation sensor, wherein the scintillator comprises at least one radiation absorption region and at least one spatially discrete radiative exciton recombination region for receiving excitons from the at least one radiation absorption region. A scintillator of any construction described herein can be used in a scintillator counter. In some embodiments, an electromagnetic radiation sensor comprises a photomultiplier tube (PMT) or a photodiode. An electromagnetic radiation sensor, in some embodiments, is operable to detect visible radiation, infrared radiation, ultraviolet radiation or combinations thereof.

V. Methods of Producing Scintillators

In another aspect, methods of producing scintillators are described herein. In some embodiments, a method of producing a scintillator comprises providing a radiation absorption region comprising a first material having a first bandgap and locally modulating the first bandgap to trap excitons in a spatially discrete radiative exciton combination region, wherein locally modulating the first bandgap comprises providing the radiative exciton recombination region in electrical communication with the radiation absorption region, the radiative exciton recombination region comprising a second material having a second bandgap different from the first bandgap.

Figure 6:
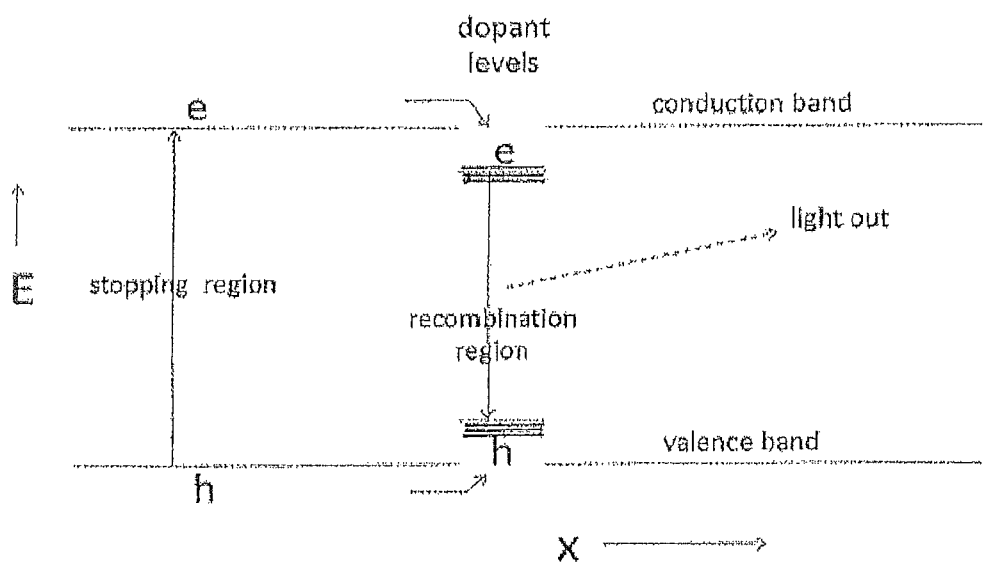
FIG. 6 illustrates a scintillator and the associated electronic structure according to one embodiment described herein.

In some embodiments, the second bandgap is smaller or of lower energy than the first bandgap. In some embodiments, the first material comprises a metal halide free or substantially free of a scintillation activator and the second material comprises a metal halide having incorporated therein one or more scintillation activators as described herein. FIG. 6 illustrates the electronic structure of a scintillator comprising a metal halide radiation absorption region and a spatially discrete metal halide radiative exciton recombination region comprising scintillation activator according to one embodiment described herein. As illustrated in FIG. 6, the scintillation activator localized to the radiative exciton recombination region provides energy or dopant levels facilitating the acceptance of electron and hole carriers from the metal halide radiation absorption region for radiative recombination.

Additionally, in some embodiments, a method of producing a scintillator comprises providing a radiation absorption region comprising a metal halide free or substantially free of a scintillation activator and providing a spatially discrete radiative exciton recombination region in electrical communication with the radiation absorption region, the radiative exciton recombination region comprising a metal halide comprising one or more scintillation activators. In some embodiments, the metal halide radiation absorption region is single crystalline, and the spatially discrete radiative exciton combination region comprises a phase of metal halide comprising scintillation activator within the single crystal. In some embodiments, for example, phases of metal halide comprising activator are precipitated from the single crystalline phase while cooling the metal halide crystal from melt.

Moreover, in some embodiments, polycrystalline scintillators can be produced according to the methods disclosed in sections II and III hereinabove.

In another aspect, the present invention provides methods of converting radiation of a first energy into radiation of a second energy. In one embodiment, a method of converting radiation of a first energy into radiation of a second energy comprises providing a scintillator comprising at least one radiation absorption region and at least one spatially discrete radiative exciton recombination region, absorbing the radiation of the first energy in the radiation absorption region to generate excitons and recombining at least some of the excitons in the spatially discrete radiative exciton recombination region to emit radiation of a second energy. In some embodiments, the radiation of the first energy has a wavelength less than the wavelength of the radiation of the second energy. As described herein, in some embodiments, the radiation absorption region of the scintillator comprises a metal halide free or substantially free of a scintillation activator, and the spatially discrete radiative exciton recombination region comprises a metal halide comprising one or more scintillation activators.

In a further aspect, the present invention provides a method of reducing non-proportional response in a scintillator. In one embodiment, a method of reducing non-proportional response comprises providing a scintillator comprising at least one radiation absorption region and at least one spatially discrete radiative exciton recombination region, absorbing radiation of a first energy in the radiation absorption region to generate excitons, transferring at least some of the excitons out of the radiation absorption region and into the spatially discrete radiative exciton recombination region and recombining the excitons to emit radiation of a second energy from the radiative exciton recombination region. In some embodiments, the radiation absorption region of the scintillator comprises a metal halide free or substantially free of a scintillation activator, and the spatially discrete radiative exciton recombination region comprises a metal halide comprising one or more scintillation activators.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A polycrystalline scintillator comprising:
sintered crystalline semiconductor particles, the crystalline semiconductor particles formed of a radiation absorption region of a first semiconductor material and a spatially discrete radiative carrier recombination region of a second semiconductor material operable to receive carriers produced in the radiation absorption region.

2. The polycrystalline scintillator of claim 1, wherein the crystalline semiconductor particles have core-shell architecture.

3. The polycrystalline scintillator of claim 2, wherein the radiative carrier recombination region is at the core of the semiconductor particles and the radiative absorption region is part of the shell surrounding the core.

4. The polycrystalline scintillator of claim 3, wherein shells of the sintered crystalline semiconductor particles form a continuous radiation absorption matrix with radiative carrier recombination regions dispersed in the continuous radiation absorption matrix.

5. The polycrystalline scintillator of claim 2, wherein the crystalline semiconductor particles have a size ranging from about 20 nm to about 100 µm.

6. The polycrystalline scintillator of claim 2, wherein the radiation absorption region of one or more of the crystalline semiconductor particles has a size ranging from about 10 nm to about 500 nm.

7. The polycrystalline scintillator of claim 1, wherein the radiation absorption region has a carrier mobility of at least about $1 \cdot 10^{-4}$ cm$^2$/V·s.

8. The polycrystalline scintillator of claim 1, wherein the radiation absorption region has a carrier mobility ranging from about $1 \cdot 10^{-4}$ cm$^2$/V·s to about 1000 cm$^2$/V·s.

9. The polycrystalline scintillator of claim 1, wherein the radiation absorption region has a carrier mobility ranging from about $1 \cdot 10^{-2}$ cm$^2$/V·s to about 100 cm$^2$/V·s.

10. The polycrystalline scintillator of claim 1, wherein the first semiconductor material is a II/VI semiconductor.

11. The polycrystalline scintillator of claim 1, wherein the second semiconductor material is a II/VI semiconductor material.

12. The polycrystalline scintillator of claim 1, wherein the first semiconductor material and the second semiconductor material are binary II/VI semiconductors.

13. A method of making a polycrystalline scintillator comprising:
providing crystalline semiconductor particles, the crystalline semiconductor particles formed of a radiation absorption region of a first semiconductor material and a spatially discrete radiative carrier recombination region of a second semiconductor material operable to receive carriers produced in the radiation absorption region; and
sintering the crystalline semiconductor particles.

14. The method of claim 13, wherein the crystalline semiconductor particles have core-shell architecture.

15. The method of claim 14, wherein the radiative carrier recombination region is at the core of the semiconductor particles and the radiative absorption region is part of the shell surrounding the core.

16. The method of claim 15, wherein sintering the crystalline semiconductor particles forms a continuous radiation absorption matrix with radiative carrier recombination regions dispersed in the continuous radiation absorption matrix.

17. The method of claim 14, wherein the crystalline semiconductor particles have a size ranging from about 20 nm to about 100 μm.

18. The method of claim 14, wherein the radiation absorption region of one or more of the crystalline semiconductor particles has a size ranging from about 10 nm to about 500 nm.

19. The method of claim 13, wherein the radiation absorption region has a carrier mobility of at least about $1 \cdot 10^{-4}$ cm$^2$/V·s.

20. The method of claim 13, wherein the radiation absorption region has a carrier mobility ranging from about $1 \cdot 10^{-4}$ cm$^2$/V·s to about 1000 cm$^2$/V·s.

* * * * *